United States Patent
Ma et al.

(10) Patent No.: US 9,843,024 B2
(45) Date of Patent: Dec. 12, 2017

(54) METHODS FOR FABRICATING OLEDS

(71) Applicant: Universal Display Corporation, Ewing, NJ (US)

(72) Inventors: Ruiqing Ma, Morristown, NJ (US); John Felts, Alameda, CA (US); Jeffrey Silvernail, Yardley, PA (US); Zhaoqun Zhoi, Bedford, MA (US); Emory Krall, Philadelphia, PA (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 58 days.

(21) Appl. No.: 14/559,516

(22) Filed: Dec. 3, 2014

(65) Prior Publication Data

US 2016/0164043 A1    Jun. 9, 2016

(51) Int. Cl.
*H01L 51/00* (2006.01)
*H01L 51/56* (2006.01)
*H01L 51/52* (2006.01)

(52) U.S. Cl.
CPC .......... *H01L 51/56* (2013.01); *H01L 51/003* (2013.01); *H01L 51/0005* (2013.01); *H01L 51/0026* (2013.01); *H01L 51/5253* (2013.01)

(58) Field of Classification Search
CPC ........ H01L 21/02367; H01L 21/02518; H01L 21/02623
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,984,934 | B2 | 1/2006 | Moeller et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo, et al., "Highly Efficient Phosphorescent Emission from Organic Electroluminescent Device", Nature, vol. 395, 151-154, (1998).

(Continued)

*Primary Examiner* — Cheung Lee
(74) *Attorney, Agent, or Firm* — Morris & Kamlay LLP

(57) ABSTRACT

Systems and methods for fabricating an OLED are provided, which include dispensing a substrate material onto a substrate carrier, the substrate carrier being rotated by one or more drums, curing the substrate material to form a substrate, depositing at least one OLED onto the substrate, and separating the substrate from the substrate carrier.

13 Claims, 8 Drawing Sheets

(56) References Cited

U.S. PATENT DOCUMENTS

| | | | |
|---|---|---|---|
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2008/0217622 | A1* | 9/2008 | Goyal ............... H01L 21/0237 257/64 |
| 2009/0042829 | A1 | 2/2009 | Matar et al. |
| 2015/0064883 | A1* | 3/2015 | Dykaar ............ H01L 21/02422 438/479 |
| 2015/0090960 | A1* | 4/2015 | Ma ...................... H01L 51/003 257/40 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Jang, et al., "Robust TFT Backplane for Flexible AMOLED"; Invited Paper; SID 2012 Digest; c. 2012; pp. 260-263.

Tsujimura, et al., "Flexible OLED using Plastic Barrier Film and its Roll-to-Roll Manufacturing"; Invited Paper; SID 2014 Digest; c. 2014; pp. 104-107.

* cited by examiner

METHODS FOR FABRICATING OLEDS

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to fabrication of devices such as organic light emitting diodes and other devices by dispensing a substrate material onto a moveable substrate carrier, and devices fabricated according to such techniques.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

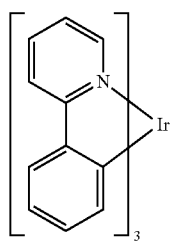

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a method for fabricating an OLED may include dispensing a substrate material onto a substrate carrier, wherein the substrate carrier is rotated by one or more drums, curing the substrate material to form a substrate, depositing at least one OLED onto the substrate, and separating the substrate from the substrate carrier.

The substrate material may be continuously dispensed onto the substrate carrier.

The substrate material may be dispensed onto the substrate carrier in discrete portions.

The method may further include cleaning a surface of the substrate carrier.

The method may further include depositing a release agent on the surface of the substrate carrier to facilitate the separation of the substrate from the substrate carrier.

The substrate material may be in liquid form.

The substrate material may be dispensed using, for example, slot die coating, spray coating, doctor blade coating, extrusion coating, or ink-jet printing.

The substrate may be cured using, for example, temperature baking, ultraviolet (UV) curing, or combinations thereof.

The method may further include depositing a substrate barrier onto the substrate prior to depositing the OLED onto the substrate material.

The substrate barrier may be deposited, for example, using mash evaporation, sputtering, PECVD, ink jet printing, or ALD.

The substrate barrier may be a material such as, for example, a metal, an oxide, an organic material, a nitride, a mixture of a polymeric material and a non-polymeric material, a mixture of an organic material and an inorganic material and a composite material.

The method may further include depositing a cover film onto the OLED.

The substrate carrier may be a material, for example, such as metal, glass, polymer, or composite material.

The substrate carrier may include surface features which mold a surface of the substrate to form surface features on the substrate.

The surface features may be formed directly in the substrate carrier.

The surface features may be formed in a separate material which is applied to the substrate carrier.

The molded surface features may include a plurality of features, for example, microlenses, micro-prisms, grooves, aerogel or other shapes of protrusions.

Depositing the OLED may include depositing a first electrode layer onto the substrate barrier, depositing one or more OLED layers onto the first electrode layer, and depositing a second electrode layer onto the one or more OLED layers.

The method may further include depositing a thin film encapsulation layer onto the second electrode layer.

The first electrode may be formed of a transparent conductive oxide.

The method may further include patterning the first electrode layer during the deposition of the transparent conductive oxide.

The one or more OLED layers may include a hole transport layer, an electron blocking layer, an emitting layer, a hole blocking layer, an electron transport layer, and an electron injection layer.

The one or more OLED layers may include one or more layers such as, for example, a hole transport layer, an electron blocking layer, an emitting layer, a hole blocking layer, an electron transport layer, and an electron injection layer.

The method for further include separating the substrate and the OLED from the substrate carrier.

The method may further include, after separating the substrate from the substrate carrier, depositing one or more layers of material on a surface of the substrate opposite the surface of the substrate material upon which the OLED was deposited.

The substrate material may remain in contact with the substrate carrier until the substrate material is separated from the substrate carrier, and the substrate carrier may be in thermal contact with at least one of the drums.

The method may further include cooling the one or more drums in thermal contact with the substrate carrier.

The method may further include depositing a plurality of OLEDs onto the substrate, and separating the plurality of OLEDs from each other.

The step of separating the OLEDs from each other may be performed subsequent to separating the plurality of OLEDs from the substrate carrier.

The substrate may be transparent.

The substrate may be flexible.

The substrate may have a refractive index of at least 1.6.

The substrate may have a glass transition temperature higher than 200° C.

The substrate carrier surface may be continuous.

According to an embodiment, a system for fabricating an OLED includes a substrate carrier, a dispensing device to dispense a substrate material onto the substrate carrier, a curing device to cure the substrate material to form a substrate, a depositing device to deposit an OLED onto the substrate, and one or more rotatable drums in physical communication with the substrate carrier and configured to move the substrate carrier past each of the dispensing device, the curing device, and the depositing device The dispensing device may continuously dispense the substrate material onto the substrate.

The dispensing device may dispense the substrate material onto the substrate in discrete portions.

The system nay include a cleaning device to clean the substrate carrier.

The system may include a lamination device to apply a cover film onto the OLED.

The system may include a winding drum to wind the substrate with the deposited OLED from the substrate carrier.

The one or more rotatable drums may include a single rotatable drum having a first surface to function as the substrate carrier.

The dispensing device, the curing device and the depositing device may be arranged around the single rotatable drum.

The dispensing device, the curing device and the depositing device may be positioned beneath the substrate carrier.

The dispensing device may be, for example, an ink jet printing device.

The substrate carrier may include surface features which mold a surface of the substrate to form surface features on the substrate.

The molded surface features may include a plurality of features, for example, microlenses, micro-prisms, groves, or other shapes of protrusions.

The system may include a secondary dispensing device to, after the substrate is separated from the substrate carrier, deposit one or more material layers on a surface of the substrate opposite the surface upon which the OLED was deposited.

The one or more material layers may be any of, for example, a barrier layer, an optical layer, or a lamination layer.

The system may further include a cooling unit to cool the one or more drums.

According to an embodiment, a system for fabricating an OLED includes a rotatable drum, a dispensing device to dispense a substrate material onto the rotatable drum, a curing device to cure the dispensed substrate material to form a substrate, and a depositing device to deposit an OLED onto the substrate.

A surface of the rotatable drum may include surface features which mold a surface of the substrate material to form surface features on the substrate material.

The molded surface features may include a plurality of surface features, such as, for example, microlenses, microprisms, groves, or other shapes of protrusions.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
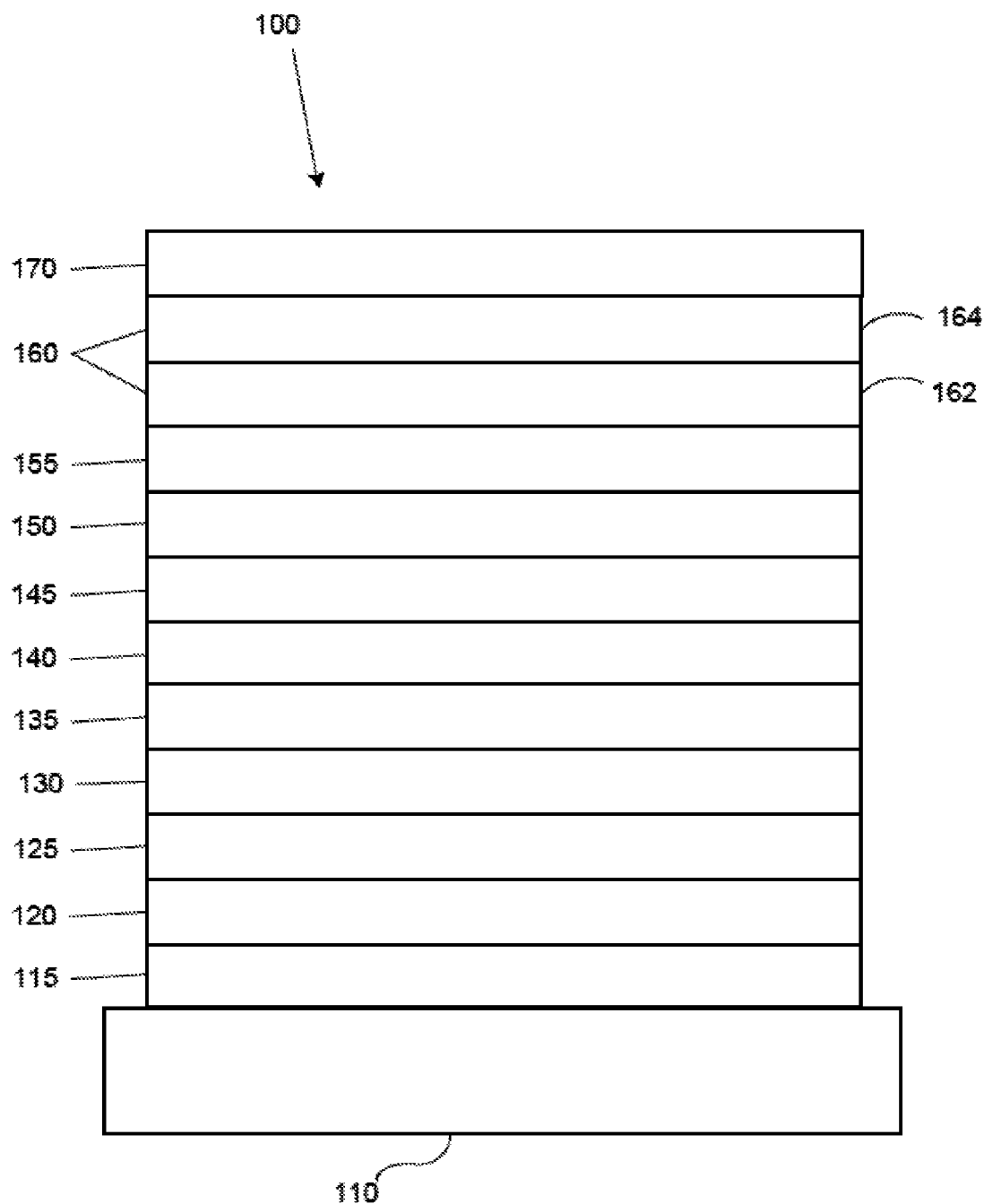
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
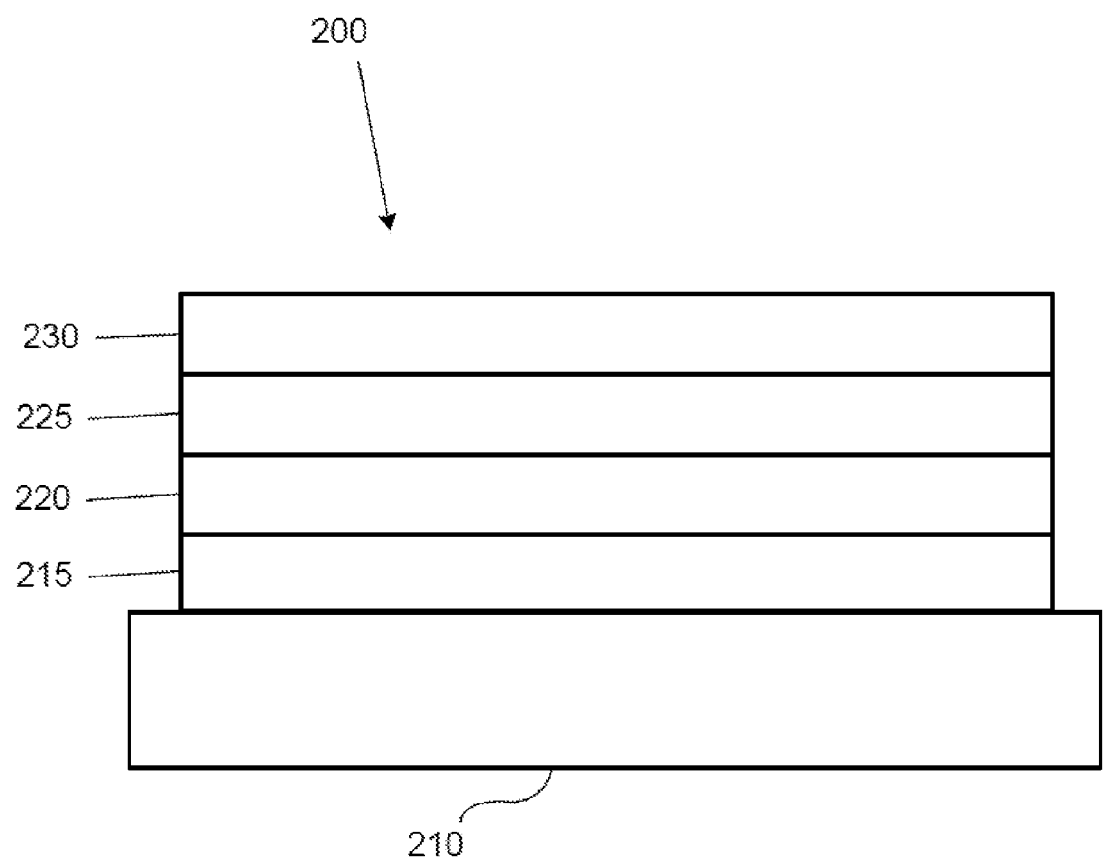
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, tights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Flat panel displays may be made using a sheet-to-sheet process, where one or multiple devices are made on a single piece of glass. Each glass substrate stops at different process stations. At each station, once the process is done, the glass substrate moves out and next glass substrate moves into the process station. When OLEDs are built on flexible substrates such as polymer films, the process may be developed to fit the sheet-to-sheet process based on rigid glass. One method may be to attach the plastic film to a carrier glass by an adhesive layer. After the device is made, the plastic film may be released from the carrier glass. This method requires an adhesive material that is sticky enough to fix the plastic but not so sticky that the plastic substrate cannot be released. One of the major challenges of this approach is to develop polymer films with good thermal and surface quality. A different approach may be pursued by casting polymer films directly on carrier glass and building OLED on the casted films using the sheet-to-sheet process.

OLEDs may be fabricated directly on polymer films using roll-to-roll process. However, polymer films are very difficult to process, especially the registration and alignment of the film during the roll-to-roll process. Also, the surface quality is still a challenging issue in this approach.

One technique to fabricate flexible OLEDs uses coated materials such as a polymer coating applied on a mold with a non-even surface. The polymer coating serves as the substrate for OLED to be built upon. The side next to the mold forms micro-lens protrusions to improve light extraction. When many micro-lenses with a certain pattern are used, they form a micro-lens array (MLA). The top surface of the substrate may be used for building OLEDs. This approach may be used in both a sheet-to-sheet process and a conveyor belt process. In conveyor belt process, a flexible mold is attached to a conveyor belt, as illustrated in FIG. 3.

Figure 3:
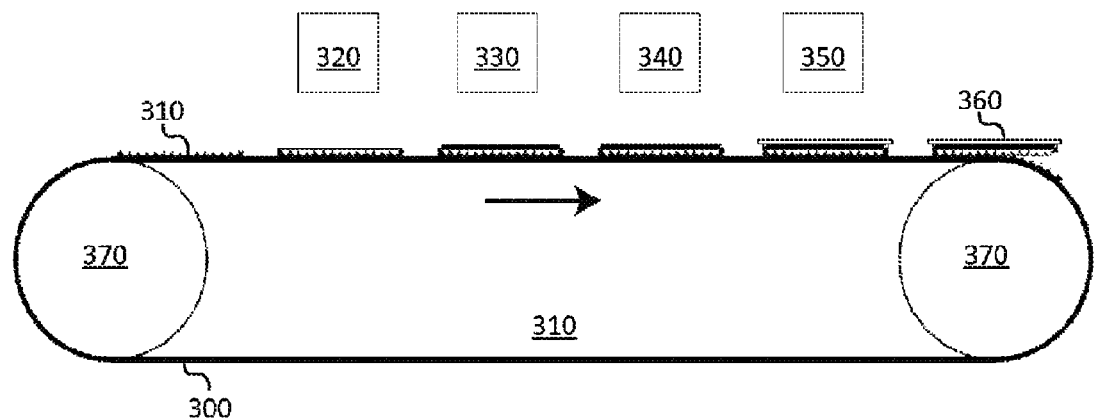
FIG. 3 shows a conveyor belt type of system to make OLEDs.

Referring to FIG. 3, as a mold 310 moves with a conveyor belt 300, different materials may be deposited on the mold 310 as the mold 310 moves past stations 320, 330, 340, and 350. At the end of the process, the processed mold 360 may bend around the roller and when the substrate-mold interface is the weakest interface, the assembly of the substrate and the OLED will peel off from the processed mold 360. In such embodiments, the corresponding apparatus can include a belt 300 a mechanism 370 to move the belt 300, which can be any conventional belt driving means, and a flexible mold 310 disposed on the belt 300, wherein the flexible mold 310 has surface features. The apparatus can also include the following in sequential order along a path of the belt: a dispenser 320 attached to a source of substrate material, an energy source 330 adapted to treat the substrate material to form a substrate, a plurality of dispensers 340, 350 attached to sources for applying the materials making up the components of the OLED, and a mechanism adapted to remove the assembly of the substrate and OLED from the processed mold 360 disposed on the belt 300.

Provided herein are methods and systems to fabricate OLED devices on flexible substrates. The substrate materials may be casted on a substrate carrier which has a continuous surface as opposed to on discrete carrier substrates. The substrate materials may be cured to form substrates. The OLED devices are then built on top of the substrates. By the end of the process, the substrate together with OLED devices are separated from the substrate carrier.

Figure 4:
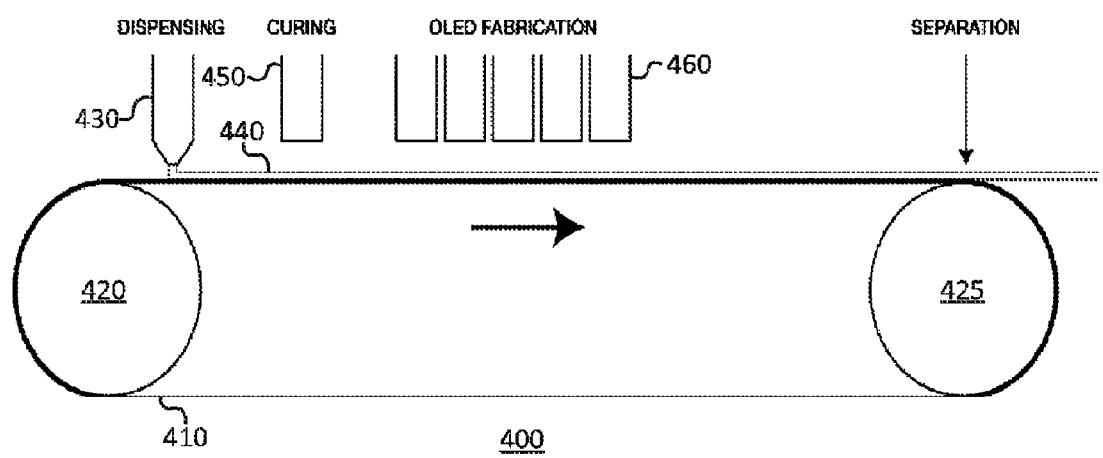
FIG. 4 shows a system to fabricate OLEDs by casting substrate material onto a substrate carrier according to the present disclosure.

Referring to FIG. 4, a substrate carrier system 400 is illustrated. The substrate carrier 410 may move along different process stations sequentially. A substrate carrier 410 may be looped around two rotating drums 420, 425. Substrate carrier 410 may be constructed of a sturdy but flexible material, for example, a stainless steel foil. At least one of the drums 420, 425 can drive the movement of the substrate carrier 410, e.g., by applying appropriate force to the stainless steel foil under tension. Extra support rollers (not illustrated) can be used to support the substrate carrier 410.

A dispensing unit 430 may dispense substrate material 440 onto the substrate carrier 410. Unlike the '194 system illustrated in FIG. 3, in system 400 the dispensing unit 430 may dispense substrate material 440 in a continuous flow directly onto the substrate carrier 410.

A curing unit 450 cures the dispensed substrate material 440 as it is carried past the curing unit 450 by the substrate carrier 410. One or more OLED layer depositing units 460 deposit OLED layers on the cured substrate material 440. The formed OLED device may be separated from the substrate carrier 410, for example, when the processed substrate material 440 reaches the drum 425. Further details of example operation of the system 400 will be provided The system 400 differs from conventional roll-to-roll systems, which are essentially configured to begin operation with a roll of plastic layers and proceed to unroll the roll of plastic, apply OLED layers, then roll the processed plastic up again. In contrast, system 400 does not use an initial roll of material, but instead is configured to directly dispense substrate material 440 onto a substrate carrier 410. System 400 may avoid several problems inherent in roll-to-roll techniques.

For example, material that is stored in an initial roll for a roll-to-roll system may be pressed together on top of each other within the roll Due to surface contact, the material can damage each other. In fact, the surface quality of typical films by roll-to-roll process is very poor due to the fabrication process and handling. Furthermore, the material typically must be cleaned when it is unrolled, adding further steps and expense. In addition, the material may shift when rolled, which may cause additional damage to the substrate or a material deposited on the substrate. System 400 provides improved position and environmental control over the substrate carrier 410 and substrate material 440. The substrate carrier 410 may be maintained in a pristine environment and the substrate material 440 is directly dispensed and processed without having been stored in a roll so it may have a pristine surface quality.

Figure 5:
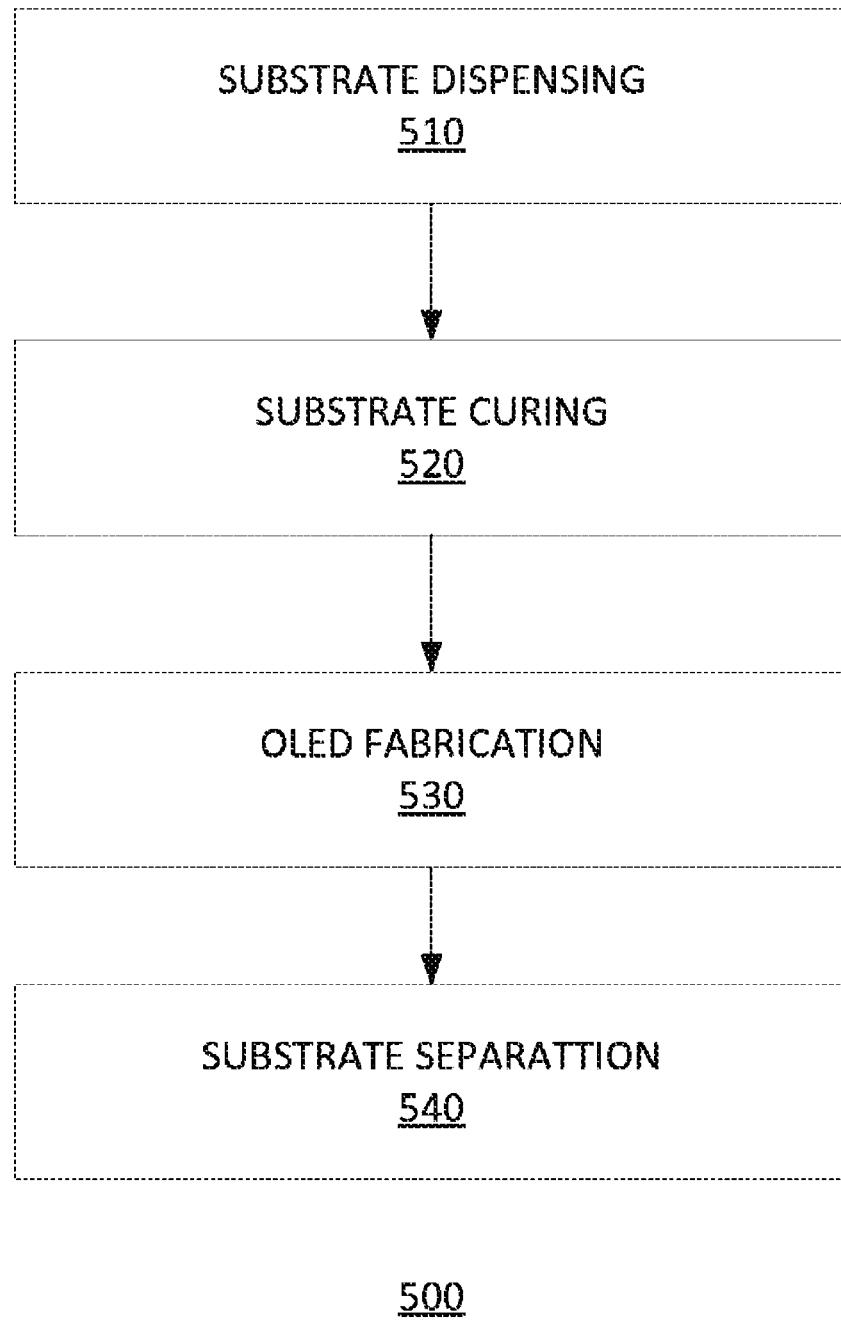
FIG. 5 shows a flowchart of a method of fabricating OLEDs.

Referring to FIGS. 4 and 5, flowchart 500 illustrates an example process of operations of system 400. At operation 510, the dispensing unit 430 dispenses substrate material 440 onto the substrate carrier 410. The dispensing unit 430 may be configured to cast substrate material 440 onto the substrate carrier 410 to form a uniform coating. The dispensing unit 430 may be configured to cast substrate material 440 using any of various techniques, for example, slot die coating, spray coating, inkjet printing, doctor blade coating, extrusion coating or other printing techniques.

At operation 520 the curing unit 450 cures the substrate material 440 to form a substrate. The substrate material 440 coating may be treated by the curing unit 450 to achieve one or more desired properties. The curing unit 450 may be configured to apply any of various curing techniques including, for example, high temperature baking, UV curing, or other techniques.

At operation 530 the OLED is fabricated by one or more OLED layer depositing units 460 configured to deposit at least one OLED onto the substrate. The OLED fabrication may include multiple steps, such as substrate barrier deposition, bottom electrode deposition, deposition of various OLED layers, top electrode deposition, and thin film layer encapsulation. Each of these steps will be described below, however, it will be understood by one of ordinary skill in the art that the steps and order of steps of OLED fabrication operation 530 may vary. The one or more OLED layer depositing units 460 may be configured to apply additional steps and/or omit or replace some of the described steps without falling outside of the scope of the present disclosure.

In an example embodiment, OLED fabrication may begin with a substrate barrier deposition step, in which a substrate barrier layer may be deposited using techniques including, for example, sputtering, plasma-enhanced chemical vapor deposition (PECVD), atomic layer deposition (ALD), and other techniques. The substrate barrier layer may function to prevent moisture and oxygen from reaching, contaminating or attacking OLED devices. Barrier materials may be selected from metals, oxide, organic materials, a nitride, composite materials or other materials that have barrier property.

A bottom electrode may be deposited on the substrate barrier layer in the bottom electrode deposition step. The bottom electrode material may be, for example, a transparent conductive oxide (TCO) such as indium tin oxide (ITO) or indium zinc oxide (IZO). In many cases, this bottom electrode layer needs to be patterned. Patterning can be carried out through, for example, photolithography or using shadow masks during deposition of the electrode material. The bottom electrode also may be printed with a desired pattern using any suitable printing techniques.

The OLED layers deposition step may include depositing a number of layers to form the OLED. Example layers may include a hole injection layer (HIL), a hole transport layer (HTL), an electron blocking layer (EBL), an emitting layer (EML), a hole blocking layer (EBL), an electron transport layer (ETL), an electron injection layer (EIL), and any other layer known or suitable for use in an OLED. The layers can be deposited, for example, using vacuum thermal deposition (VTE), ink jet printing or other printing techniques.

A top electrode may be deposited on the OLED layers. The top electrode may be formed using a metal.

A thin film encapsulation layer may be deposited on the top electrode to serve as a barrier layer to prevent moisture and oxygen from reaching or attacking OLED devices. It can also provide mechanical protection during subsequent processing steps.

Referring back to FIG. 5, at operation 540 the casted substrate 440 is separated from the substrate carrier 410. This process may occur prior to or when the substrate carrier 410 moves around the second drum 425, as illustrated in FIG. 4.

In addition to the operations listed in flowchart 500, system 400 may be configured to execute other operations. Without limitation, such other operations could include a cleaning operation, a pretreatment operation, additional coating operations, a lamination operation, a slitting operation, a winding operation and an inspection operation.

Figure 6:
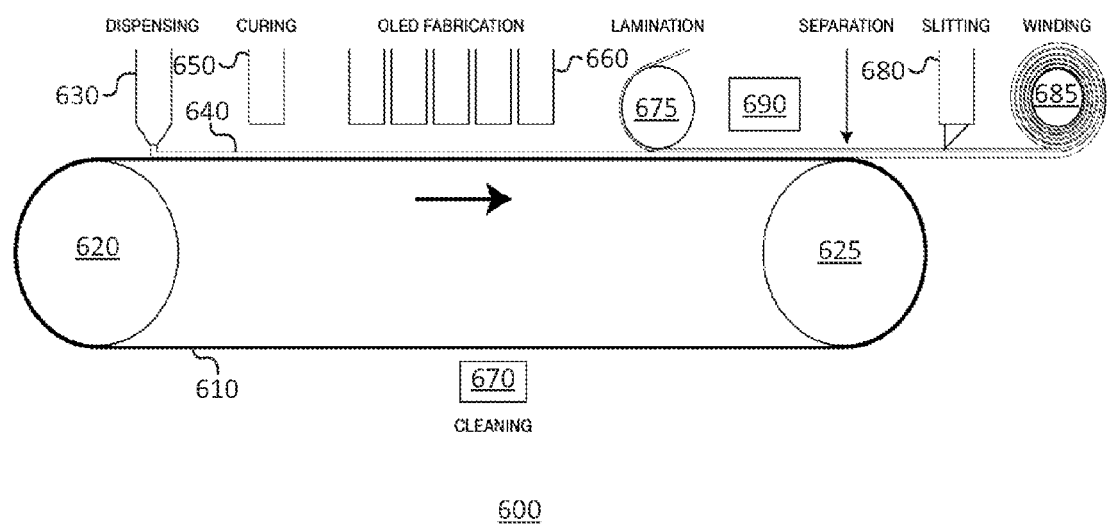
FIG. 6 shows another embodiment of a system to fabricate OLEDs by casting substrate material onto a substrate carrier according to the present disclosure.

FIG. 6 illustrates an example embodiment system 600 configured to execute the operations of system 400 along with other operations. The substrate carrier 610, dispensing unit 630, curing unit 650, and drums 620, 625 are similar to the corresponding elements in system 400 and will not be further described here. In addition to these elements, the embodiment of system 600 includes a cleaning unit 670, a lamination unit 675, a slitting unit 680, a winding roller 685, and an inspection unit 690.

Cleaning unit 670 may clean a surface of the substrate carrier 610 before the substrate material 640 is deposited. OLED depositing unit 660 may include a pretreatment unit, for example to apply a release agent to the substrate material 640 to facilitate the separation of the substrate from the substrate carrier 610. For example, a surface of the substrate carrier 610 can be treated with either physical or chemical process to accommodate the adhesion or release purposes. The surface modification can be patterned on dedicated areas dependent on the requirements of substrate/mold adhesion and release. Furthermore, OLED depositing unit 660 may be configured to apply other functional coating layers, for example, planarization coatings, outcoupling coatings, and/or dielectric mirror coatings. To facilitate the application of various layers, the units comprising the OLED depositing unit 660 may be positioned further upstream or downstream as required.

Furthermore, after the substrate is separated from the substrate carrier 610, an additional dispensing device (not illustrated), may deposit one or more material layers on a surface of the substrate opposite the surface upon which the OLED was deposited. The one or more material layers may include, for example, a barrier layer, an optical layer and/or a lamination layer.

Lamination unit 675 may apply lamination after the OLED devices are fabricated on the substrate, but before they are separated from substrate carrier 610. For example, a cover film can be glued to the OLED devices for mechanical protection. The cover film can be formed using, for example, metal foils, polymer films, or barrier coated polymer films. Another lamination layer (not shown) can be applied to the other side of the substrate after it is separated from substrate carrier.

Slitting unit 680 may cut the processed substrate. For example, if a wide web is used to make multiple devices along the transverse direction, the devices can be separated from each other by slitting the substrate after it is separated from the substrate carrier 610.

An inspection unit 690 may be placed along the path of device movement where quality control is needed. A winding roller 685 may optionally wind the substrate with finished devices.

Figure 7:
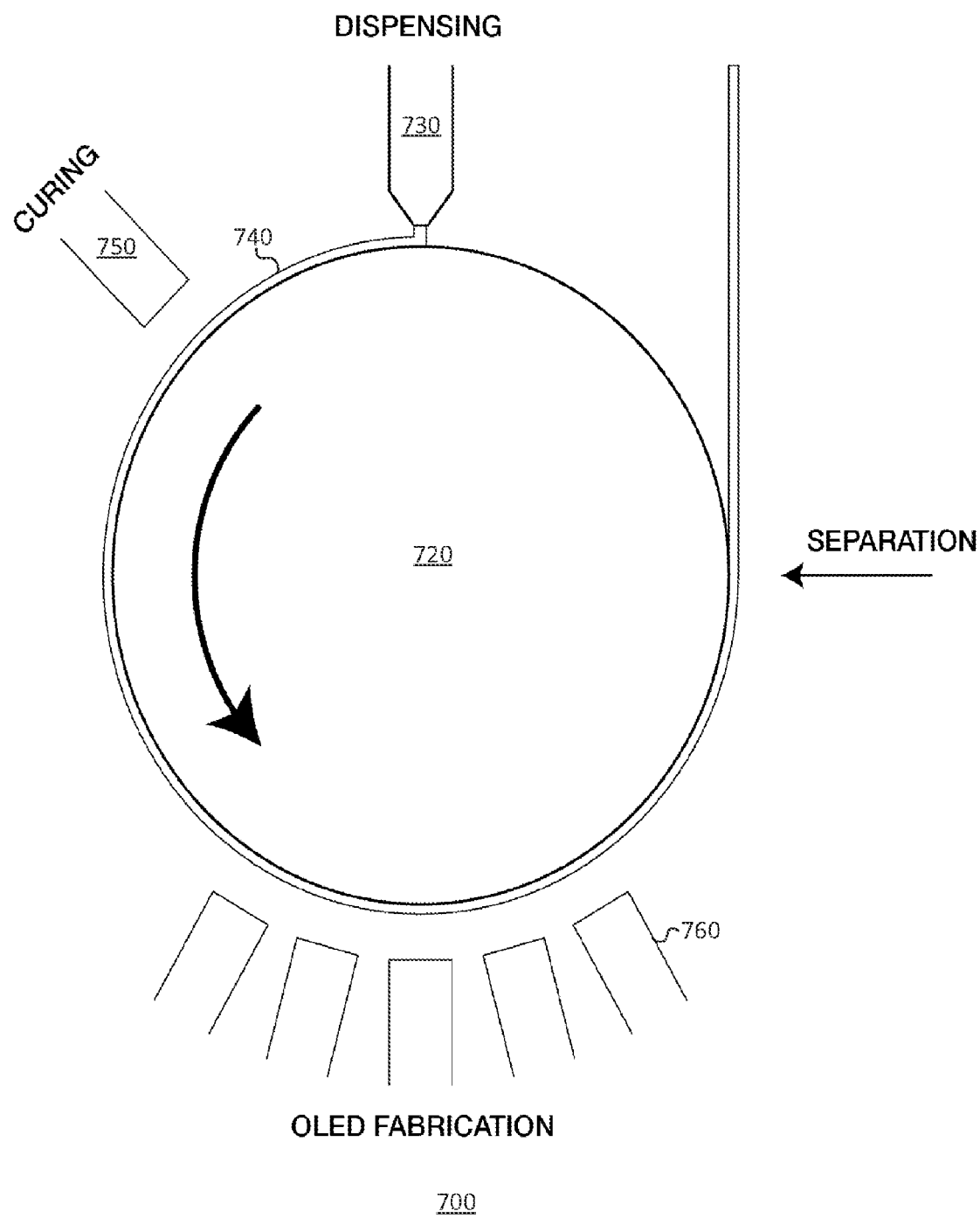
FIG. 7 shows an embodiment of a system for casting substrate material on a single drum surface which serves as the substrate carrier according to the present disclosure.

FIG. 7 shows an example system as disclosed herein in which a single drum is used. In system 700, the conveyor belt type of configuration of systems 400 and 600 may be replaced by a single rotating drum 720. The surface of drum 720 may serve as the substrate carrier. Dispensing unit 730, curing unit 750 and OLED depositing unit 760, similar to the corresponding units described above regarding systems 400 and 600, may be arranged around the drum 720. One advantage of this configuration is a relatively small footprint, The drum 720 can be made from single material or multiple materials. For example, the drum 720 may be constructed to have a base drum and then a laminated top layer around the base drum. This top layer may include surface features, such as to form outcoupling features or other structure on the substrate as it is deposited on the surface of the drum, for example as described with respect to FIG. 9, or it may be flat. Furthermore, this top layer may be easily replaced in the event of damage, wear, or to alter the surface features created in a deposited substrate.

Figure 8:
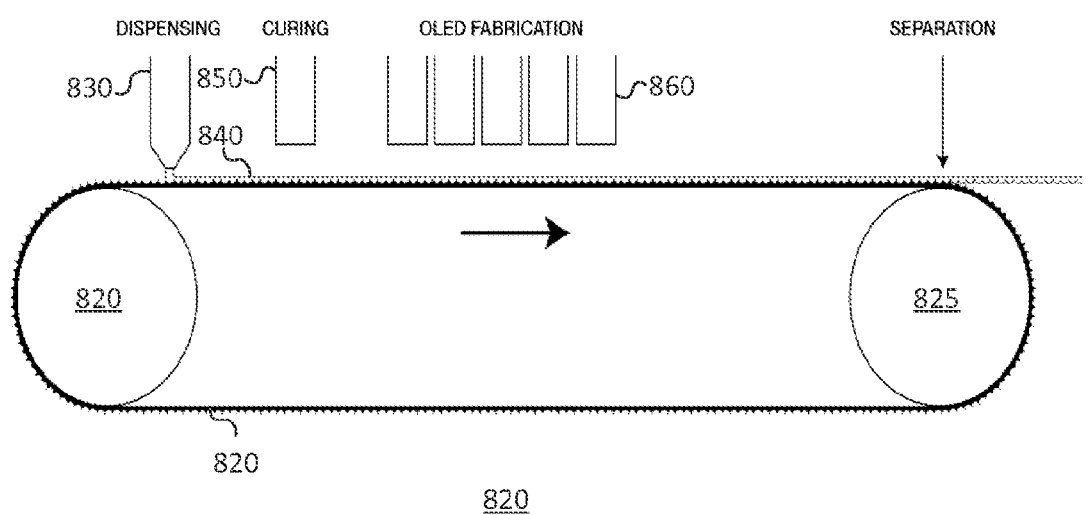
FIG. 8 shows an embodiment of a system including a substrate carrier surface having surface features to improve light extraction of the OLED devices according to the present disclosure.

FIG. 8 illustrates an embodiment of a system 800, having a conveyor belt configuration. Aspects of system 800 which are similar to systems 400 and 600 described above will not be further described here. In system 800, substrate carrier 810 can have surface features (mold), as illustrated in FIG. 8. As a result, a surface of the substrate material 840 will form surface features which will help to extract light from the devices, for example, microlenses, micro-prisms, grooves, aerogel or other shapes or protrusions. The surface features can be made directly on the substrate carrier 810, or they may be made on a separate material and then applied on top of a base material. In the latter case, the substrate carrier 810 may have two layers of materials: a base material for support and a top layer to provide surface features.

Figure 9:
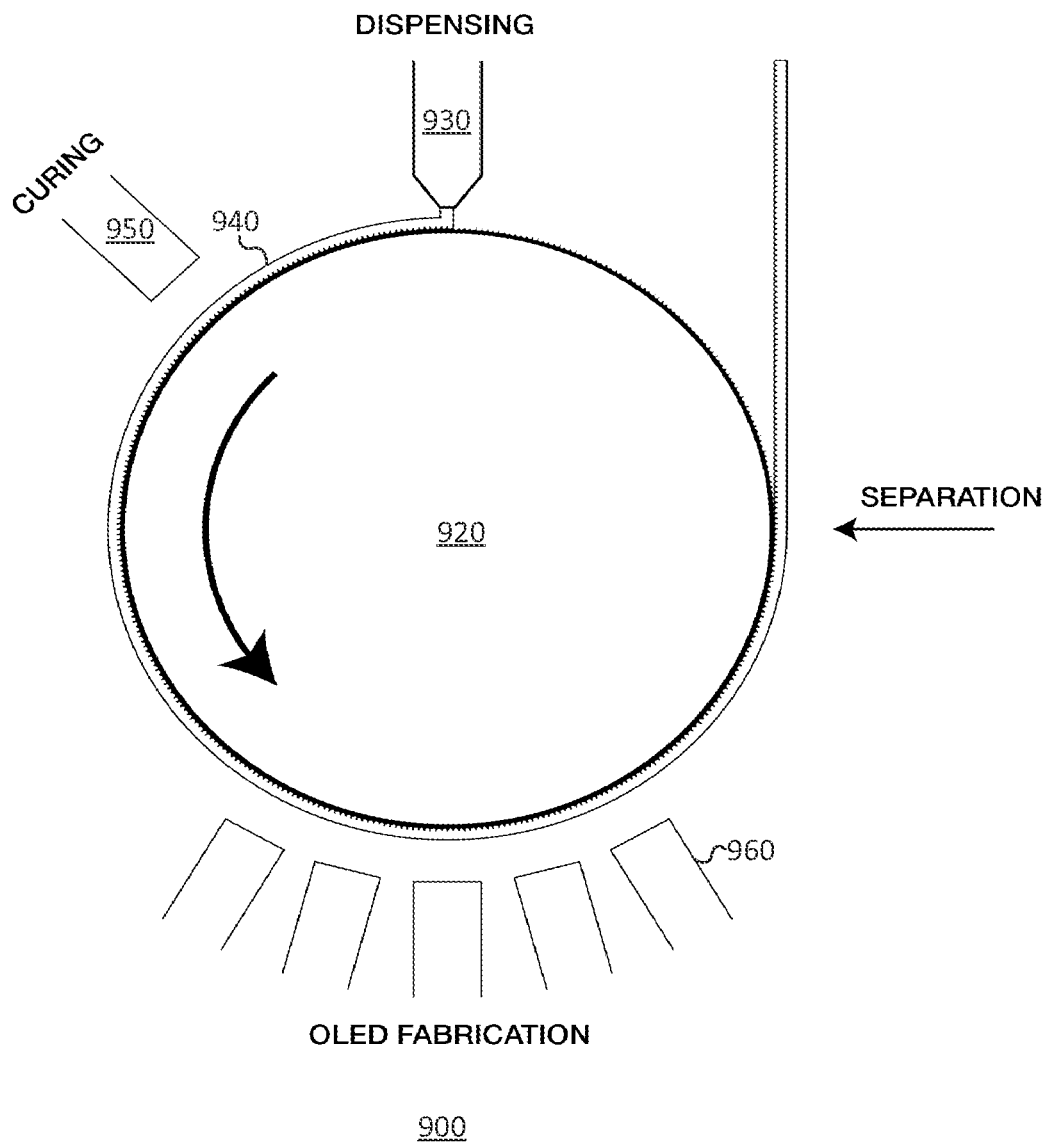
FIG. 9 shows an embodiment of a system including a single drum configuration with surface features on the substrate carrier according to the present disclosure.

Similarly, FIG. 9 illustrates a single drum embodiment system 900 with surface features on the substrate carrier 910.

In any of the embodiments disclosed, the casted substrate materials can be selected from polymers, inorganic materials such as glass, composite materials or any other materials that can be casted. For example a polymer can be dissolved in solvent and then casted on to the substrate carrier. After solvent is evaporated the polymer forms a uniform film. Another example is to coat monomers in a liquid form, then polymerize the monomers using thermal energy or UV to form films. Inorganic materials can be casted by Sol-Gel approach. The formed substrate may have a high glass transition temperature, for example to support process temperatures above 150 C, 200 C, 250 C, 300 C, or higher. The substrate may have a refractive index of at least 1.6.

The movement of the substrate carrier can be steady or the substrate carrier may stop occasionally or periodically during a fabrication process. In the latter case, the substrate stops at each unit or station for treatment or deposition. After the process is finished, the substrate is moved to the next unit or station. This configuration may require more precise control in the dispensing process.

A directly deposited substrate material as described in the disclosed embodiments provides several advantages. The separation process may be executed easier than roll-to-roll or sheet-to-sheet processes. The finished devices can be wound into a roller at comparatively high speed in a lower cost process. In addition, in the embodiments of systems 700 and 900, the substrate carrier may remain in thermal contact with the drum. Accordingly, the substrate carrier may facilitate cooling of the systems better than a roll-to-roll or sheet-to-sheet system. Additional cooling devices such as a cooling unit or one or more fans may be employed to actively cool the drum.

Although for convenience of explanation the described units or process stations are illustrated above the substrate surface, the units and/or process stations can be positioned above, under, to the side of the substrate surface. For example, to reduce the particle deposition on the substrate, the process stations may be positioned under the substrate material.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method for fabricating organic light emitting diodes (OLEDs), comprising:
    dispensing a substrate material onto a substrate carrier, the substrate carrier moved by one or more drums;
    curing the substrate material to form a substrate;
    depositing at least one OLED onto the substrate; and
    subsequent to depositing the at least one OLED onto the substrate, separating the substrate from the substrate carrier.

2. The method of claim 1, wherein the substrate material is continuously dispensed onto the substrate carrier.

3. The method of claim 1, further comprising;
    depositing a substrate barrier onto the substrate prior to depositing the OLED onto the substrate.

4. The method of claim 3, wherein depositing the OLED comprises:
    depositing a first electrode layer onto the substrate barrier;
    depositing one or more OLED layers onto the first electrode layer; and
    depositing a second electrode layer onto the one or more OLED layers.

5. The method of claim 4, further comprising depositing a thin film encapsulation layer over the second electrode layer.

6. The method of claim 1, further comprising depositing a cover film onto the OLED.

7. The method of claim 1, wherein the substrate carrier includes surface features which mold a surface of the substrate to form surface features on the substrate.

8. The method of claim 7, wherein the molded surface features comprise a plurality of features selected from the group consisting of: microlenses, micro-prisms, grooves, aerogel or other shapes of protrusions.

9. The method of claim 1, further comprising:
    separating the substrate and the OLED from the substrate carrier.

10. The method of claim 9, further comprising, after separating the substrate from the substrate carrier, depositing one or more layers of material on a surface of the substrate opposite the surface of the substrate upon which the OLED was deposited.

11. The method of claim 9, wherein the substrate remains in contact with the substrate carrier until the substrate is separated from the substrate carrier, and wherein the substrate carrier is in thermal contact with at least one of the drums.

12. The method of claim 1, wherein the substrate carrier surface is continuous.

13. The method of claim 1, wherein the dispensing operation, the curing operation and the depositing operation are executed by devices arranged around a single rotatable drum.

* * * * *

UNITED STATES PATENT AND TRADEMARK OFFICE
CERTIFICATE OF CORRECTION

PATENT NO. : 9,843,024 B2  
APPLICATION NO. : 14/559516  
DATED : December 12, 2017  
INVENTOR(S) : Ruiqing Ma et al.

It is certified that error appears in the above-identified patent and that said Letters Patent is hereby corrected as shown below:

On the Title Page

Item (72) Please correct fourth inventor's name from "Zhaoqun Zhoi" to --Zhaoqun Zhou--.

Signed and Sealed this
Twenty-eighth Day of August, 2018

Andrei Iancu
*Director of the United States Patent and Trademark Office*